(12) United States Patent
Satoh

(10) Patent No.: US 6,895,228 B2
(45) Date of Patent: May 17, 2005

(54) HIGH FREQUENCY LOW-PASS FILTER

(75) Inventor: Yuki Satoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 367 days.

(21) Appl. No.: 10/182,304

(22) PCT Filed: Dec. 20, 2001

(86) PCT No.: PCT/JP01/11177

§ 371 (c)(1),
(2), (4) Date: Oct. 10, 2002

(87) PCT Pub. No.: WO02/054591

PCT Pub. Date: Jul. 11, 2002

(65) Prior Publication Data

US 2003/0143972 A1 Jul. 31, 2003

(51) Int. Cl.[7] .................................................. H04B 1/18
(52) U.S. Cl. .............................. 455/168.1; 455/150.1; 455/339; 455/176.1
(58) Field of Search ................................ 455/339, 334, 455/552.1, 550.1, 82–83, 133, 137, 150.1, 168.1, 176.1, 188.1, 78; 333/101, 132

(56) References Cited

U.S. PATENT DOCUMENTS

| | | | | |
|---|---|---|---|---|
| 5,715,525 | A | * | 2/1998 | Tarusawa et al. ........... 455/101 |
| 6,445,262 | B1 | * | 9/2002 | Tanaka et al. ............... 333/133 |
| 6,759,925 | B2 | * | 7/2004 | Satoh et al. ................. 333/133 |
| 2002/0068530 | A1 | * | 6/2002 | Li ................................ 455/82 |
| 2002/0086650 | A1 | * | 7/2002 | Haapoja ...................... 455/120 |
| 2002/0137471 | A1 | * | 9/2002 | Satoh et al. .................... 455/83 |
| 2002/0183016 | A1 | * | 12/2002 | Kemmochi et al. ........... 455/83 |
| 2003/0092397 | A1 | * | 5/2003 | Uriu et al. ..................... 455/82 |
| 2003/0189910 | A1 | * | 10/2003 | Yamada et al. ............. 370/335 |
| 2004/0075968 | A1 | * | 4/2004 | Satoh et al. .............. 361/306.3 |
| 2004/0119560 | A1 | * | 6/2004 | Tsurunari et al. ........... 333/133 |

FOREIGN PATENT DOCUMENTS

| | | |
|---|---|---|
| JP | 51-67012 | 6/1976 |
| JP | 56-103514 | 8/1981 |
| JP | 60-136408 | 7/1985 |
| JP | 62-274908 | 11/1987 |
| JP | 2-130118 | 10/1990 |
| JP | 10-294634 | 11/1998 |
| JP | 11-205066 | 7/1999 |
| JP | 11-215023 | 8/1999 |

OTHER PUBLICATIONS

International Search Report corresponding to application No. PCT/JP01/11177 dated Apr. 9, 2002.
English translation of PCT/ISA/210.

* cited by examiner

*Primary Examiner*—Sonny Trinh
(74) *Attorney, Agent, or Firm*—RatnerPrestia (57) ABSTRACT

A low pass filter (LPF) can realizes a sophisticated transmission filter usable in a dual-band application. The transmission filter features a compact size, a low cost, a lower insertion loss, and an excellent harmonics-suppression characteristic. In the LPF, a high pass filter (HPF) section working in a high frequency band or a band pass filter (BPF) section, is coupled with a first LPF section in parallel between an input terminal and an output terminal. The HPF section or the BPF section includes a switch circuit formed of one diode that switches the pass band thereof to a rejection band. When a signal supposed to pass through the first LPF section is input to the input terminal, the switch circuit is activated to change the HPF or the BPF section to the rejection band for blocking a second harmonics component from passing through the HPF or the BPF section.

22 Claims, 7 Drawing Sheets

HIGH FREQUENCY LOW-PASS FILTER

This Application is a U.S. National Phase Application of PCT International Application PCT/JP01/11177.

TECHNICAL FIELD

The present invention relates to a high frequency low-pass filter (LPF) employed in mobile communication devices such as a cellular phone.

BACKGROUND ART

Recently mobile communication devices including cellular phones have prevailed in the market, and the devices have been downsized and tagged with a lower price. This market situation demands that the components of the cellular phones be further downsized and the costs thereof be further lowered.

Figure 11:
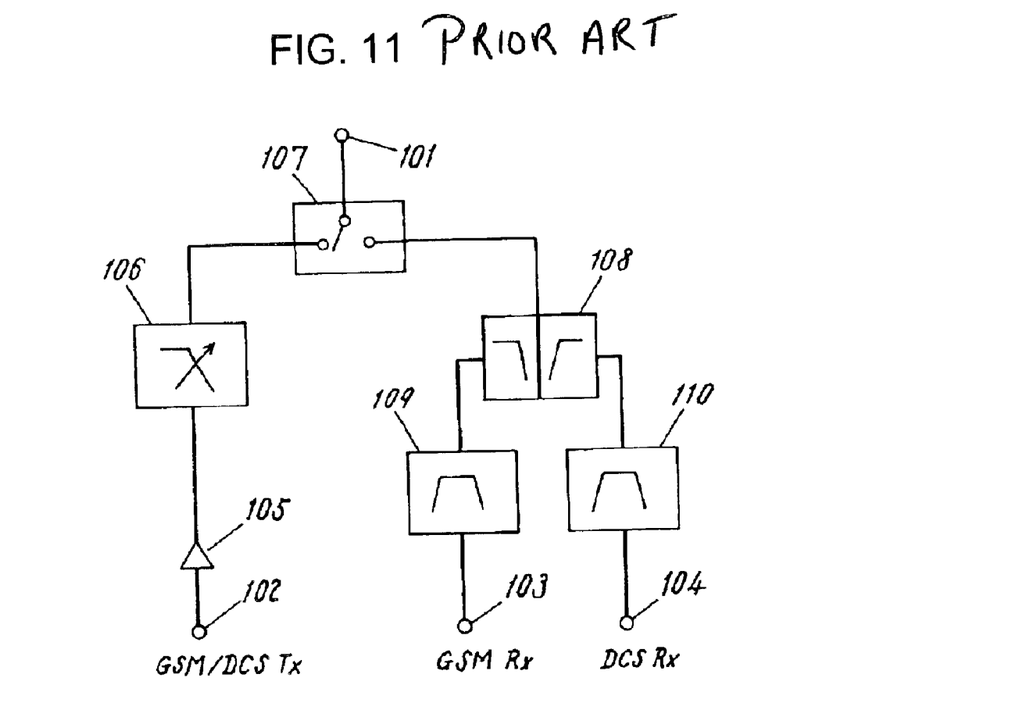
FIG. 11 is a block circuit diagram of a front end of a widely accepted cellular phone usable in GSM/DCS dual-band.

FIG. 11 is a circuit block diagram of a front end of a dual-band cellular phone usable in both Global System for Mobile Communication (GSM) and Digital Cellular System (DCS). This dual-band cellular phone has rapidly gained popularity on a worldwide level particularly in Europe. GSM uses 880–915 MHz as a transmitting frequency and 925–960 MHz as a receiving frequency, while DCS uses 1,710–1,785 MHz as a transmitting frequency and 1,805–1,880 MHz as a receiving frequency.

A transmission signal, applicable to both GSM and DCS, produced in a cellular phone runs through transmitting terminal 102 and is amplified by power amplifier (hereinafter referred to as PA) 105, then the signal is fed into high frequency low-pass filter (hereinafter referred to as LPF) 106.

This high powered transmission signal undergoes LPF 106 as well as transmit/receive switch 107, and arrives at antenna terminal 101. On the other hand, a receipt signal, applicable to both GSM and DCS, received by an antenna runs through antenna terminal 101, switch 107, and is fed into diplexer (branching circuit) 108. The receipt signal is branched into a signal of GSM and a signal of DCS, and both signals undergo respective receiving filters 109 and 110 before arriving at respective receiving terminals 103 and 104.

At this front-end, it is avoided providing PA 105 to respective bands but one PA is shared by both the bands of GSM and DCS with each other for power amplification so that a number of components can be reduced. This one PA for dual-band is going to be a main stream in the market.

In the foregoing structure, a critical point is how to restrain harmonics component developed at the high power amplification done in the PA. For this purpose, if a normal LPF of which cut-off frequency is simply higher than the DCS band is provided, second harmonics of GSM overlap with a transmission band of DCS. Thus the second harmonics of GSM cannot be restrained. Therefore, a cut-off frequency of LPF 106 should be switched to an adequate value responsive to GSM transmission and DCS transmission.

Figure 12:
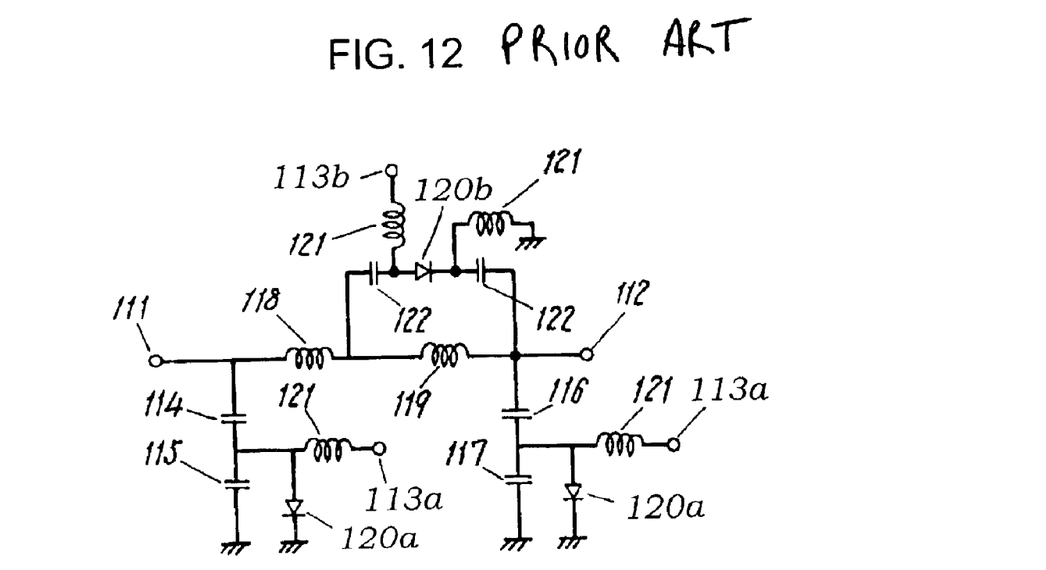
FIG. 12 is a detailed circuit diagram of a conventional high-frequency LPF.

As a result, a conventional LPF is formed of a π type C-L-C filter. These C, L and C comprise a series circuit formed of capacitors 114, 115, another series circuit formed of inductor 118, 119, and still another series circuit formed of capacitors 116, 117 respectively.

In FIG. 12, the conventional LPF has input terminal 111 and output terminal 112. A direct current (DC) is applied to control terminals 113a and 113B for turning on/off diodes 120a and 120b respectively. Inductor 121 and capacitor 122 work as a choke coil and a DC-blocking capacitor respectively.

In FIG. 12, DC voltages applied to control terminals 113a, 113b are set at a High status and a Low status respectively, and diodes 120a, 120b are set conductive and non-conductive respectively. In this case, capacitors 115 and 117 are shorted but inductor 119 is not shorted, thus the cut-off frequency of the LPF is lowered. On the contrary, control terminals 113a, 113b are set at a Low status and a High status respectively, and diodes 120a, 120b are set non-conductive and conductive respectively. In this case, capacitors 115 and 117 are not shorted but inductor 119 is shorted, thus the cut-off frequency of the LPF is raised. As such, use of diodes 120a and 120b allows the LPF to have two cut-off frequencies that can be switched to each other, so that the pass-band is changeable. As a result, the problem discussed above is overcome.

However, according to the foregoing structure, not only at least three diodes are needed, but also components of an ON/OFF circuit for each one of these diodes are needed. Thus it is hard to downsize an entire filter circuit as well as reduce the cost thereof. Further, since numbers of diodes that adversely affect high-frequency characteristics are included in the filter circuit, insertion loss of the LPF increases. This insertion loss influences not only transmission power but also critically a service life of a battery used in a cellular phone. The more diodes are used, the shorter the service life of the battery becomes. It is rather a complicated work to control the ON/OFF of the diodes, and this complication invites some difficulty in manufacturing the filter circuit.

SUMMARY OF THE INVENTION

The present invention addresses the problems discussed above, and aims to provide a downsized and a sophisticated LPF of low cost as well as low insertion loss. For this purpose, a number of switching diodes is minimized. Further, it is not only switching a cut-off frequency of the LPF, but also newly providing the LPF with a high-pass filter (HPF section) in a high frequency band or a band pass filter (BPF section).

The LPF of the present invention comprises the following elements:
- an input terminal for receiving a signal of a high frequency band;
- an output terminal for outputting the signal of a high frequency band;
- an HPF section for filtering the signal received at the input terminal;
- a first LPF section; and
- a diode for switching a pass band of the HPF section to a rejection band.

An input section of the HPF section and an input section of the first LPF section are connected to the input terminal, and output sections thereof are connected to the output terminal.

The present invention includes the following aspects:
1. A second LPF section is added to the LPF in cascade connection, so that harmonics component of a signal passed the first LPF section or the HPF section is restrained.
2. The HPF section can be replaced with the BPF section.
3. The transmission characteristics of the HPF section or the BPF section can include an attenuation pole at a frequency within a pass band of the first LPF section.
4. On the contrary, the transmission characteristics of the first LPF section can include an attenuation pole at a frequency within a pass band of the HPF section or the BPF section.

5. A frequency of the pass band of the HPF section or the BPF section can be approx. two times as much as that of the first LPF section.
6. The second LPF section can include an attenuation pole at a higher frequency than the frequency of a signal passing through the HPF section or the BPF section and the frequency of a signal passing through the first LPF section.
7. Parts of the HPF section or the BPF section and parts of the first LPF section, or the entire HPF section or BPF section and the entire first LPF section can be formed in a dielectric laminated body. Further, a diode can be mounted on a surface of the laminated body. This construction can downsize the LPF.
8. An input terminal and an output terminal can be formed on side faces opposite to each other or bottom faces opposite to each other of the laminated body, so that isolation between the respective terminals can be improved.

DETAILED DESCRIPTION OF EXEMPLARY EMBODIMENTS

Exemplary embodiments of the present invention are demonstrated with reference to the accompanying drawings.
Exemplary Embodiment 1

Figure 1:
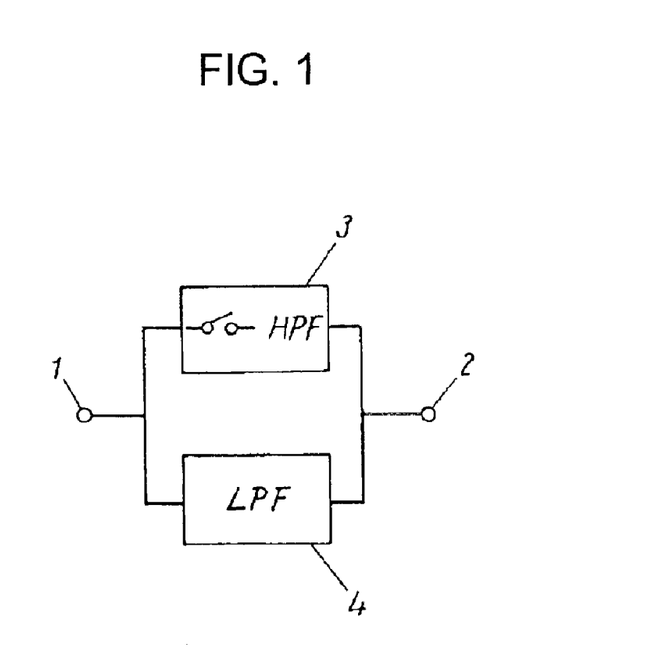
FIG. 1 is a block circuit diagram illustrating an example of a first exemplary embodiment of the present invention.

FIG. 1 is a block circuit diagram of an LPF in accordance with the first embodiment. In FIG. 1, a transmission filter of a dual-band cellular phone usable both in GSM and DCS includes input terminal 1 and output terminal 2. HPF section 3 and LPF section 4 allow a signal of DCS band and a signal of GSM band to pass therethrough respectively. A transmission frequency of DCS is 1.710–1.785 MHz, and that of GSM is 880–915 MHz.

An on/off switch is added to HPF section 3 of the LPF so that the LPF also works as a filter for rejecting harmonics component of the dual-band cellular phone. The LPF stays in a switch-on status during a DCS transmission so that a DCS transmission signal can pass through with a low insertion loss.

On the other hand, during a GSM transmission, the LPF stays in switch-off status in order to block secondary harmonics component of the GSM transmission signal from passing through HPF section 3. As a result, only a fundamental wave can passe through LPF section 4 with a low insertion loss. This structure allows the LPF to output a GSM transmission signal, of which secondary harmonics are restrained, during the GSM transmission, as well as output a DCS transmission signal during the DCS transmission. Thus a desirable LPF is obtainable.

Figure 2:
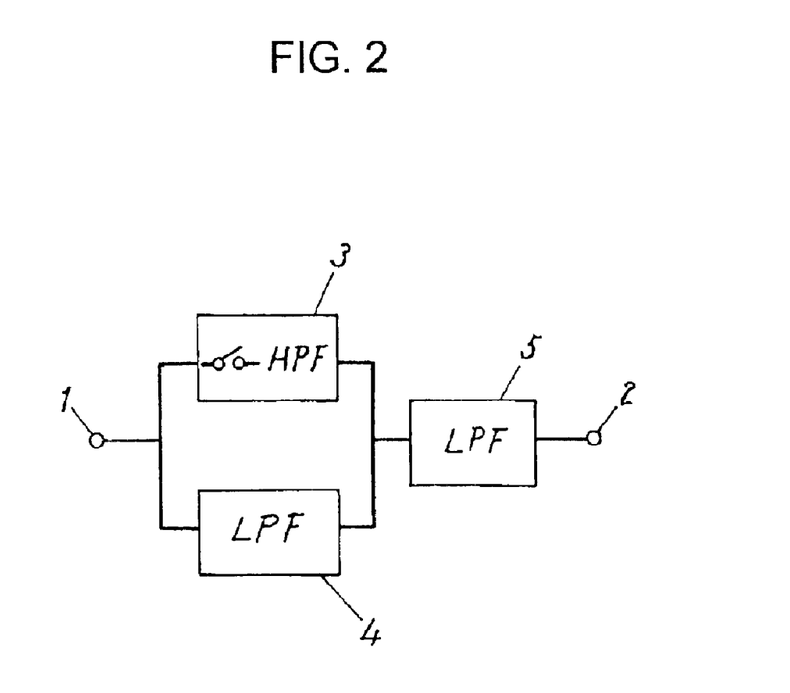
FIG. 2 is a block circuit diagram illustrating another example of the first embodiment of the present invention.

If the harmonics component of the DCS should be restrained with a simple circuit efficiently, an LPF shown in a block circuit diagram of FIG. 2 is effective. To be more specific, second LPF section 5 is coupled in series between output terminal 2 and HPF section 3, LPF section 4. This structure allows second LPF section 5 to restrain a second and onward harmonics component of DCS transmission signals as well as a third and onward harmonics component of GSM transmission signals.

Figure 3:
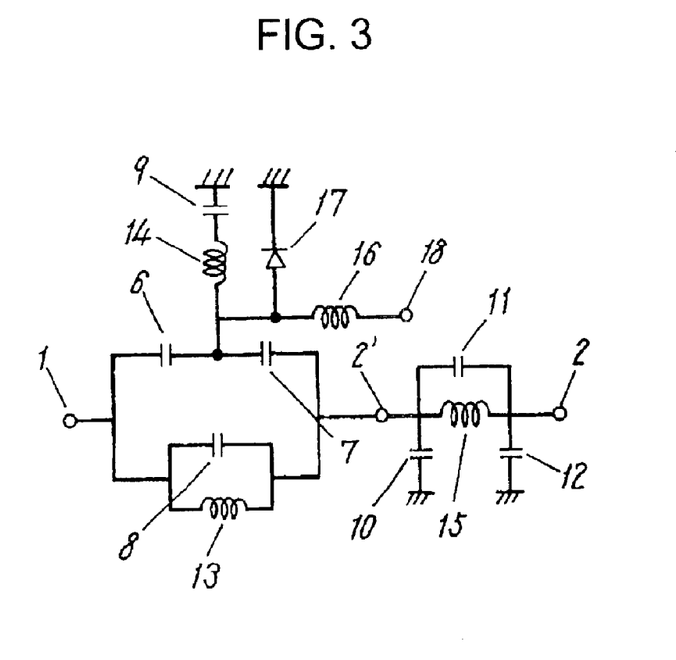
FIG. 3 is a detailed circuit diagram illustrating the first embodiment of the present invention.

FIG. 3 shows an actual circuit of the LPF based on the block diagram shown in FIG. 2. In FIG. 3, a circuit constant of a parallel circuit formed of capacitor 8 and inductor 13 is prepared so as to parallel-resonate in a DCS transmission band. A circuit constant of a series circuit formed of capacitor 9 and inductor 14 is prepared to series-resonate in a GSM transmission band.

During the DCS transmission, the parallel resonance circuit formed of capacitor 8 and inductor 13 parallel-resonates in the DCS transmission band. Therefore, a circuit between terminals 1 and 2' works as a HPF section of T-type C-L-C, and a DCS band input-signal arrived at terminal 1 can pass through the LPF without disturbing an impedance matching.

On the other hand, during the GSM transmission, the series circuit formed of capacitor 9 and inductor 14 series-resonates in the GSM transmission band. Therefore, a circuit between terminals 1 and 2' works as an LPF section of π type C-L-C, and a GSM band input-signal arrived at terminal 1 can pass through the LPF without disturbing the impedance matching.

During the GSM transmission, its second harmonics overlapping with the DCS transmission band is going to pass through a signal path (ref. FIG. 3) branched upper side between terminals 1 and 2'. At this time, a positive DC voltage is applied to control terminal 18 for making diode 17 conductive, so that the second harmonics component of the GSM cannot pass because the signal path is grounded. Harmonics component of higher frequencies than the DCS transmission band can be restrained by the second LPF section formed of capacitors 10–12 and inductor 15.

As shown in FIG. 3, a parallel-resonant circuit formed of capacitor 11 and inductor 15 is provided in the second LPF section coupled between terminals 2–2', so that the frequency characteristic of the LPF includes an attenuation pole. (the characteristic shows a sharp attenuation at a certain frequency) As such, the LPF can further restrain the harmonics component efficiently.

Instead of the parallel-resonant circuit, a series-resonant circuit formed of an inductor connected to capacitor 10, 12 respectively in series and in shunt can produce a similar advantage.

As discussed above, the LPF needs only one single diode in its circuit, which can be thus simply constructed without a complicated control system. The circuit therefore eventually needs a small number of components. As a result, a sophisticated LPF with a simple structure can obtain characteristics of a low insertion loss and characteristics of efficiently restraining harmonics component.

Exemplary Embodiment 2

Figure 4:
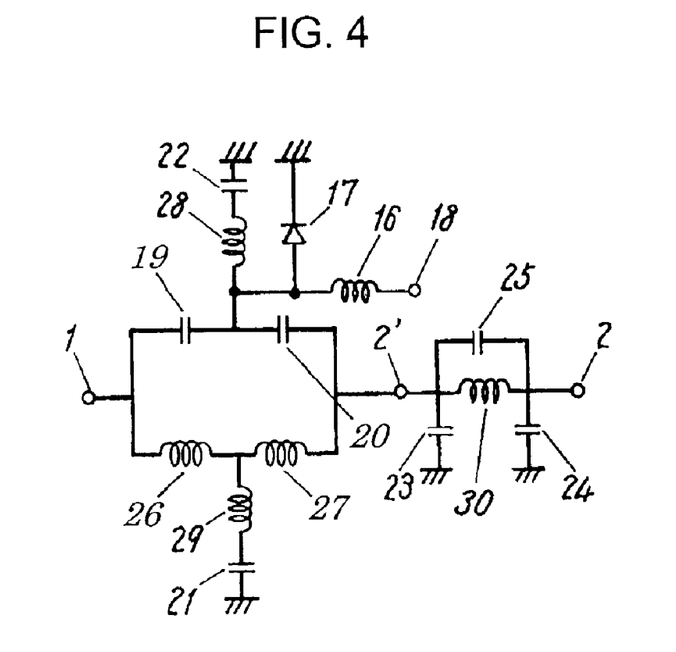
FIG. 4 is a detailed circuit diagram illustrating a second exemplary embodiment of the present invention.

FIG. 4 shows a detailed circuit diagram in accordance with the second exemplary embodiment. In FIG. 4, capacitors 19–25 and inductors 26–30 are prepared. A circuit constant of a series circuit formed of capacitor 21 and inductor 29 is set so as to series-resonate in the DCS transmission band.

A circuit constant of a series circuit formed of capacitor 22 and inductor 28 is set so as to series-resonate in the GSM transmission band.

During the DCS transmission, capacitor 21 and inductor 29 series-resonates in the DCS transmission band. Therefore, a circuit between terminals 1 and 2' works as an HPF section of five-element and π type L-C-L-C-L, and a DCS band input-signal arrived at terminal 1 can pass through the LPF without disturbing an impedance matching.

On the other hand, during the GSM transmission, the series circuit formed of capacitor 22 and inductor 28 series-resonates in the GSM transmission band. Therefore, a circuit between terminals 1 and 2' works as an LPF section of five-element and π type C-L-C-L-C, and a GSM band input-signal arrived at terminal 1 can pass through the LPF without disturbing the impedance matching.

During the GSM transmission, its second harmonics overlapping with the DCS transmission band are going to pass through a signal path (ref. FIG. 4) branched to upper side between terminals 1 and 2'. At this time, a positive voltage is applied to control terminal 18 for making diode 17 conductive, so that the second harmonics component of the GSM cannot pass because the signal path is grounded. Harmonics component of higher frequencies than the DCS transmission band can be restrained by the second LPF section connected thereafter and formed of capacitors 23–25 and inductor 30.

Figure 5:
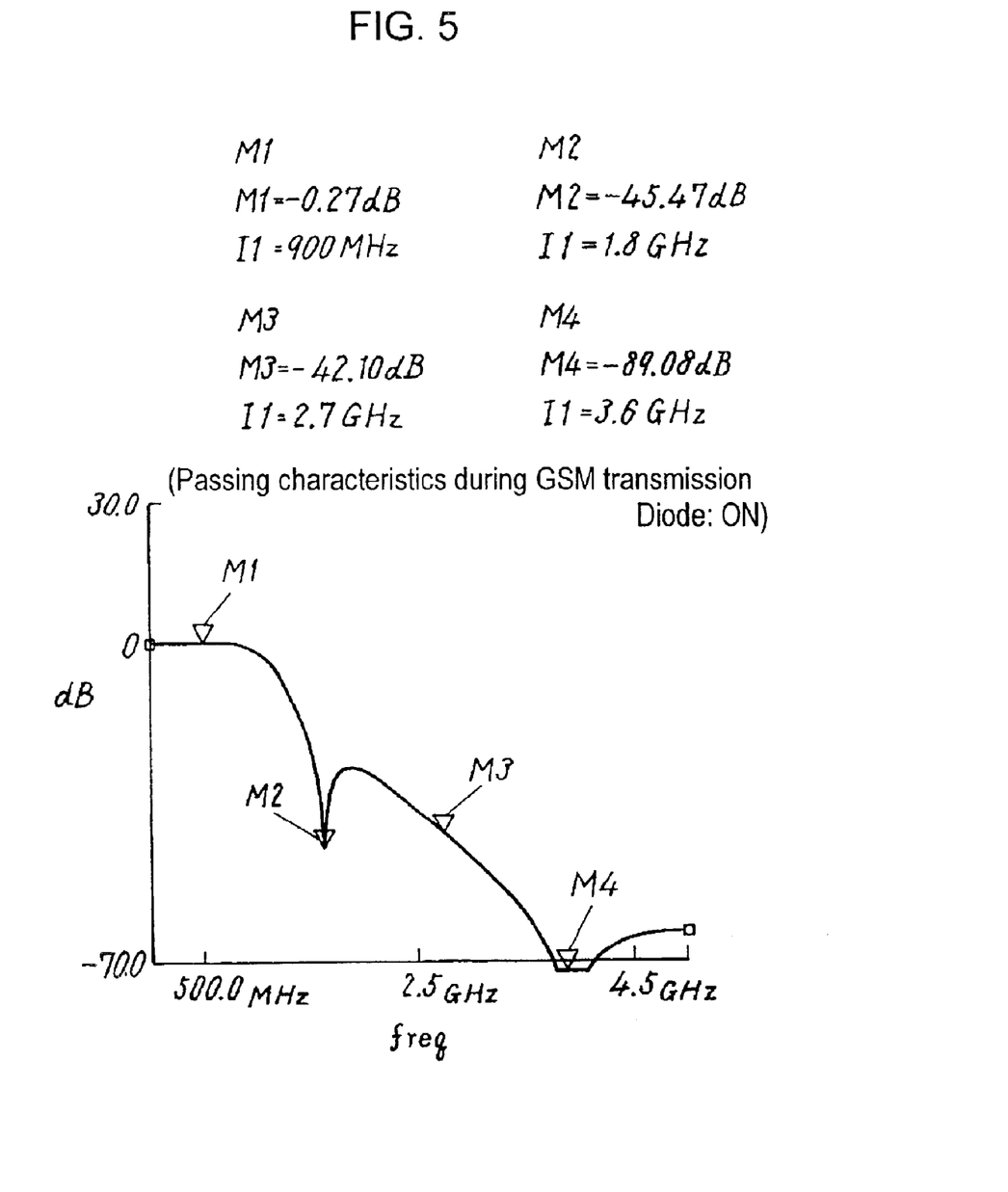
FIG. 5 shows frequency characteristics when a diode is conductive in the second embodiment of the present invention.
Figure 6:
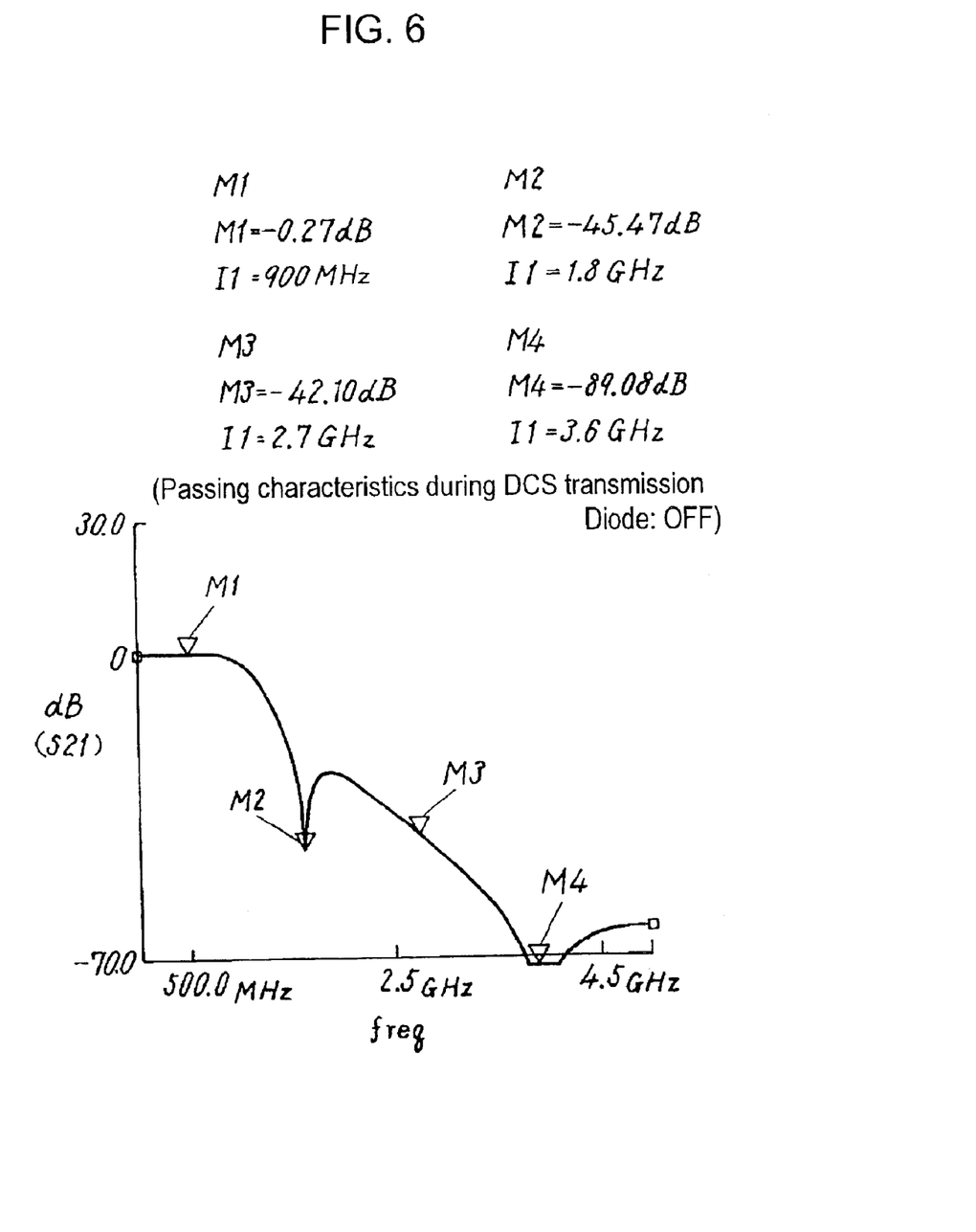
FIG. 6 shows frequency characteristics when the diode is not conductive in the second embodiment.

FIG. 5 and FIG. 6 show the passing characteristics of the LPF in accordance with the second embodiment. In these drawings, attenuation amounts M1–M4 at frequency 11 are shown. FIG. 5 shows the passing characteristics during the GSM transmission, where diode 17 is in an ON status. FIG. 6 shows the passing characteristics during the DCS transmission, where diode 17 is in an OFF status. Attenuation amounts M1–M4 mat frequency 11 are shown here. According to these passing characteristics, passing loss becomes smaller, and harmonics are substantially restrained.

In the structure discussed above, only one diode is used, and a complicated controlling system is not needed, which makes the circuit simple and reduces a number of components. As a result, a sophisticated LPF with a simple structure can obtain characteristics of a low insertion loss and characteristics of efficiently restraining the harmonics component.

As shown in FIG. 4, a parallel-resonant circuit formed of capacitor 25 and inductor 30 is provided in the second LPF section coupled between terminals 2–2', so that the frequency characteristic of the LPF includes an attenuation pole. As such, the LPF can further restrain the harmonics component efficiently.

Instead of the parallel-resonant circuit, a series-resonant circuit formed of an inductor connected to capacitor 23, 24 in series and in shunt can produce a similar advantage.

Figure 7:
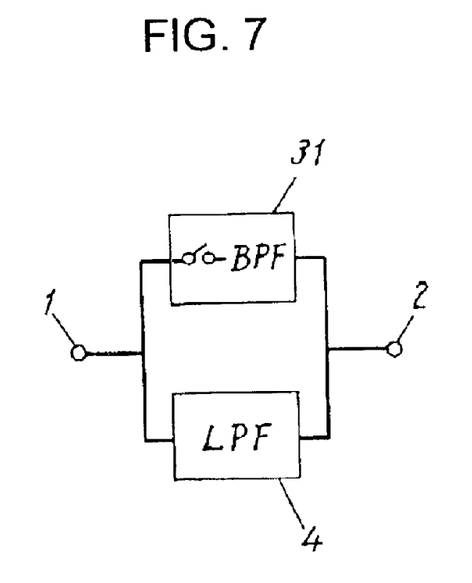
FIG. 7 is a block circuit diagram of still another example of the first embodiment.

With reference to FIG. 2, second LPF section 5 is omitted, and HPF section 3 is replaced with band pass filter (BPF) 31 as shown in FIG. 7. This structure can produce a similar advantage. In this case, since there is no second LPF section 5 (refer to FIG. 2), a signal passing through first LPF section 4 (in this embodiment, the signal is a GSM transmission signal) is not subject to a passing loss. As a result, the LPF of the present invention advantageously invites less passing loss with respect to a GSM transmission signal.

Figure 8:
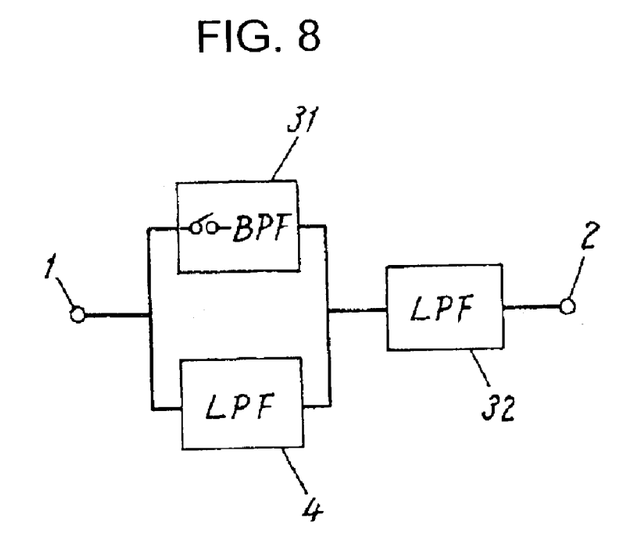
FIG. 8 is a block circuit diagram of yet still another example of the first embodiment.

When restraining the harmonics component is needed rather than lowering the passing loss, third LPF section 32 is cascade-connected to first LPF section 4 for restraining the harmonics component more efficiently.

Exemplary Embodiment 3

Figure 9:
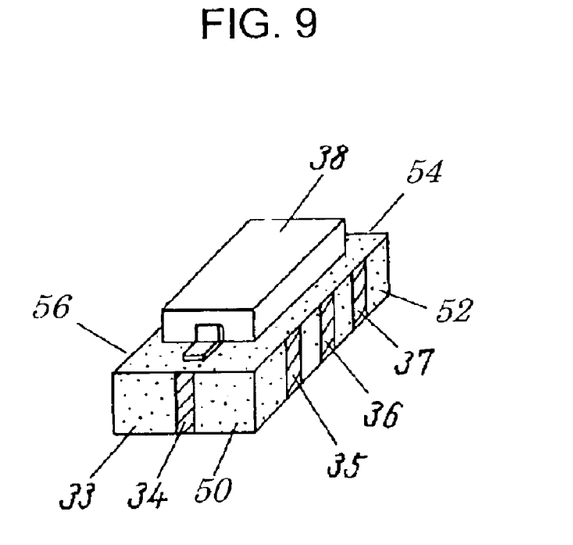
FIG. 9 is a perspective view of a structure of an object in accordance with a third exemplary embodiment of the present invention.

FIG. 9 is a perspective view of a structure of an object in accordance with the third exemplary embodiment of the present invention. In FIG. 9, the circuit components of the LPF in accordance with this embodiment are disposed as an electrode pattern (not shown) in dielectric laminated body 33, and diode 38 is mounted on a surface of laminated body 33, thereby downsizing the LPF. Outer terminals of the LPF (in FIG. 9, only outer terminals 34–37 are shown) can be prepared on a side face of laminated body 33. Further, it is desirable to prepare input and output terminals on the faces opposite to each other in order to improve an attenuation characteristic of an undesired signal, so that more sophistication of the LPF can be expected. To be more specific, when an input terminal is prepared on face 50, an output terminal is desirably prepared on face 54, or vice versa. When an input terminal is prepared on face 52, an output terminal is desirably prepared on face 56. The attenuation characteristic improves at a greater distance between an input terminal and an output terminal.

Figure 10:
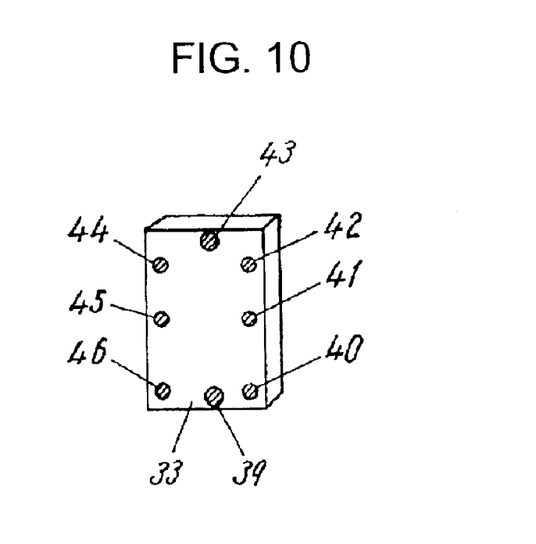
FIG. 10 is a perspective view of a structure of another object in accordance with the third embodiment.

Further, as shown in FIG. 10, when electrodes are prepared on a rear surface of laminated body 33, for instance, terminal 41 is assigned to an input terminal, terminals 45, 44 or 46 instead of terminal 40 or 42 is desirably assigned to an output terminal. A combination of terminals 39 and 43, terminals 40 and 44, or terminals 42 and 46 is desirable as a combination of input and output terminals. Because one of these combinations extends a distance between the input and output terminals, so that sufficient electrical isolation is provided between the input and output terminals. As a result, an excellent attenuation characteristic can be expected.

Industrial Applicability

An HPF section or a BPF section is connected with a first LPF section in parallel, and further, the HPF section or the BPF section is connected to a change-over switch that changes over the pass band to a rejection band. This structure allows the switch to activate to restrain the second harmonics component from passing the HPF section or the BPF section when a fundamental wave is input to the LPF as a high power signal supposed to pass through a first LPF section.

The present invention needs only one single changeover switch, thus a compact and sophisticated LPF is obtainable, and the LPF incurs only a low insertion loss and has an excellent harmonics suppression characteristic. The LPF can be widely used as a dual-band transmission filter of dual-band cellular phones.

What is claimed is:

1. A low pass filter (LPF) for filtering a signal in a high frequency band, said LPF comprising:

a high pass filter (HPF) section for filtering an input signal;

a first LPF section for filtering the input signal; and a changeover switch for changing a pass band of said HPF section to a rejection band, wherein an input section of said HPF section is coupled with an input section of said first LPF section, and wherein the output section of said HPF section is coupled with an output section of said first LPF section.

2. The LPF of claim 1 further comprising a second LPF section that is cascade-coupled with said first LPF section.

3. The LPF of claim 1 or claim 2, wherein said HPF section is assembled with a first capacitor, a series-resonant circuit formed of a first inductor and a second capacitor, and a third capacitor in T-connection, wherein a resonant frequency of the series-resonant circuit is set at a frequency within a pass band of said first LPF section;

wherein said first LPF section is formed of a parallel-resonant circuit assembled with a second inductor and a fourth capacitor, and wherein a resonant frequency of the parallel-resonant circuit is set at a frequency within a pass band of said HPF section.

4. The LPF of claim 1 or claim 2, wherein said HPF section is assembled with a fifth capacitor, a first series-resonant circuit formed of a third inductor and a sixth capacitor, and a seventh capacitor in T-connection;

wherein a resonant frequency of the series-resonant circuit is set at a frequency within a pass band of said first LPF section;

wherein said first LPF section is assembled with a fourth inductor, a second series-resonant circuit formed of a fifth inductor and an eighth capacitor, and a sixth inductor in T-connection; and wherein a resonant frequency of the second series-resonant circuit is set at a frequency within the pass band of said HPF section.

5. A low pass filter (LPF) for filtering a signal in a high frequency band, said LPF comprising:

a band pass filter (BPF) section for filtering an input signal;

a first LPF section for filtering the input signal; and a changeover switch for changing a pass band of said BPF section to a rejection band, wherein an input section of said BPF section is coupled with an input section of said first LPF section, and wherein the output section of said BPF section is coupled with an output section of said first LPF section.

6. The LPF of claim 5 further comprising a second LPF section that is cascade-coupled with said first LPF section.

7. The LPF of claim 1 or claim 2, wherein a transmission characteristic of said HPF section includes an attenuation pole at a frequency within a pass band of said first LPF section.

8. The LPF of claim 5 or claim 6, wherein a transmission characteristic of said BPF section includes an attenuation pole at a frequency within a pass band of said first LPF section.

9. The LPF of claim 1 or claim 2, wherein a transmission characteristic of said first LPF section includes an attenuation pole at a frequency within a pass band of said HPF section.

10. The LPF of claim 5 or claim 6, wherein a transmission characteristic of said first LPF section includes an attenuation pole at a frequency within a pass band of said BPF section.

11. The LPF of claim 7, wherein a series-resonant circuit coupled between a main path of said HPF section and a ground resonates at a frequency within a pass band of said first LPF section, so that said HPF section produces an attenuation pole at the frequency; and wherein a diode coupled with the resonant circuit in parallel turns to be conductive, so that a pass band of said HPF section is switched to a rejection band.

12. The LPF of claim 5, wherein a series-resonant circuit coupled between a main path of said BPF section and a ground resonates at a frequency within a pass band of said first LPF section, so that said BPF section produces an attenuation pole at the frequency; and wherein a diode coupled with the resonant circuit in parallel turns to be conductive, so that a pass band of said BPF section is switched to a rejection band.

13. The LPF of claim 1, wherein a frequency of the pass band of said HPF section is approx. twice as much as a frequency of a pass band of said first LPF section.

14. The LPF of claim 5, wherein a frequency of the pass band of said BPF section is approx. twice as much as a frequency of a pass band of said first LPF section.

15. The LPF of claim 2, wherein the second LPF section includes an attenuation pole in a frequency band higher than a frequency of a signal passing through said HPF section and said first LPF section.

16. The LPF of claim 6, wherein the second LPF section includes an attenuation pole in a frequency band higher than a frequency of a signal passing through said BPF section and said first LPF section.

17. The LPF of claim 1 or claim 2, wherein one of parts and entire of said HPF section and said first LPF section are formed in a dielectric laminated body, and said switch is mounted on a surface layer of the laminated body.

18. The LPF of claim 11, wherein one of parts and entire of said HPF section and said first LPF section are formed in a dielectric laminated body, and the diode is mounted on a surface layer of the laminated body.

19. The LPF of claim 5 or claim 6, wherein one of parts and entire of said first LPF section is formed in a dielectric laminated body, and said switch is mounted on a surface layer of the laminated body.

20. The LPF of claim 12, wherein one of parts and entire of said BPF section and said first LPF section are formed in a dielectric laminated body, and the diode is mounted on a surface layer of the laminated body.

21. The LPF of claim 17, wherein an input terminal and an output terminal are disposed on side faces opposite to each other of the laminated body, or on bottom faces opposite to each other of the laminated body.

22. The LPF of claim 19, wherein an input terminal and an output terminal are disposed on side faces opposite to each other of the laminated body, or on bottom faces opposite to each other of the laminated body.

* * * * *